(12) United States Patent
Shu et al.

(10) Patent No.: US 9,437,487 B2
(45) Date of Patent: Sep. 6, 2016

(54) ARRAY SUBSTRATE AND FABRICATION METHOD THEREOF, AND DISPLAY DEVICE

(71) Applicant: BOE TECHNOLOGY GROUP CO., LTD., Beijing (CN)

(72) Inventors: Shi Shu, Beijing (CN); Feng Zhang, Beijing (CN); Yaohui Gu, Beijing (CN); Fang He, Beijing (CN); Feng Gu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 14/574,721

(22) Filed: Dec. 18, 2014

(65) Prior Publication Data

US 2016/0148838 A1    May 26, 2016

(30) Foreign Application Priority Data

Nov. 26, 2014  (CN) .......................... 2014 1 0697709

(51) Int. Cl.
| | | |
|---|---|---|
| *H01L 21/00* | (2006.01) | |
| *H01L 21/768* | (2006.01) | |
| *H01L 27/12* | (2006.01) | |
| *G02F 1/1362* | (2006.01) | |
| *G02F 1/1368* | (2006.01) | |

(52) U.S. Cl.
CPC ....... *H01L 21/76877* (2013.01); *G02F 1/1368* (2013.01); *G02F 1/136209* (2013.01); *H01L 21/76802* (2013.01); *H01L 27/124* (2013.01); *H01L 27/1288* (2013.01); *G02F 2001/136222* (2013.01)

(58) Field of Classification Search
CPC ............... H01L 51/56; H01L 27/3244; H01L 2227/323; H01L 51/5253; H01L 2251/5338
USPC ...................................................... 438/29, 69
See application file for complete search history.

(56) References Cited

U.S. PATENT DOCUMENTS

| | | | | |
|---|---|---|---|---|
| 6,424,012 B1* | 7/2002 | Kawasaki | ......... | G02F 1/133345 257/350 |
| 2003/0117059 A1* | 6/2003 | Koo | .................... | H01L 27/3265 313/422 |
| 2008/0030434 A1* | 2/2008 | Yamazaki | ............ | G09G 3/3258 345/76 |
| 2011/0157507 A1* | 6/2011 | Koh | .................... | G02F 1/13439 349/43 |

* cited by examiner

*Primary Examiner* — Andy Huynh
(74) *Attorney, Agent, or Firm* — Ladas & Parry LLP

(57) ABSTRACT

Embodiments of the disclosure disclose an array substrate and a fabrication method thereof, and a display device. The fabrication method of the array substrate comprises: forming a thin film transistor; forming a passivation layer covering the thin film transistor, the passivation layer having a via hole and the via hole exposing at least a portion of a drain electrode of the thin film transistor; forming a via-hole conductive layer, the via-hole conductive layer covering the portion of the drain electrode exposed at the via hole and connected to the drain electrode; treating the via-hole conductive layer, so that a reflectivity of the via-hole conductive layer is lower than a reflectivity of the drain electrode; and forming a pixel electrode, the pixel electrode being connected with the drain electrode through the via-hole conductive layer.

14 Claims, 4 Drawing Sheets

ARRAY SUBSTRATE AND FABRICATION METHOD THEREOF, AND DISPLAY DEVICE

TECHNICAL FIELD

Embodiments of the disclosure relate to an array substrate and a fabrication method thereof, and a display device.

BACKGROUND

A thin film transistor liquid crystal display device mainly comprises an array substrate, a color filter substrate, and a liquid crystal layer sandwiched between the array substrate and the color filter substrate. The array substrate comprises gate lines, data lines and a plurality of pixel regions by intersecting the gate lines and the data lines with each other. Within each pixel region, there are formed a thin film transistor and a pixel electrode. The pixel electrode is connected to a drain electrode of the thin film transistor through a via hole formed in a passivation layer covering the thin film transistor. A color filter layer formed of color filters of red, green and blue (R, G, B) and a black matrix are formed on the color filter substrate. The black matrix is disposed to correspond to the thin film transistor to prevent light leakage.

In a practical process, there is often a deviation when the array substrate and the color filter substrate are bonded with each other, and thus it is necessary to increase a width of the black matrix in order to avoid light leakage caused by such deviation. However, increase of the width of the black matrix will reduce an aperture ratio of the pixel region and degrade the display quality. In order to solve the above problem, a Color filter On Array (COA) technology in which the color filter layer and the black matrix are directly formed on the array substrate emerges. In the COA technology, the color filter layer and the black matrix are formed on the array substrate together with the thin film transistor, which not only can improve the aperture ratio and brightness of the display device, but also can avoid various problems caused by forming the color filter layer and the thin film transistor on different substrates.

However, in the COA technology in which the black matrix is formed on the array substrate, although the black matrix shields the thin film transistor and the metal wires (e.g., the gate lines and the data lines), the drain electrode provided at the via hole of the passivation layer cannot be shielded by the black matrix for the drain electrode provided at the via hole of the passivation layer needs to be connected to the pixel electrode. In this case, the drain electrode at the via hole will reflect the ambient light, resulting in reduction of contrast ratio and color purity of the display device, so that the display effect of the display device is seriously affected.

SUMMARY

According to embodiments of the disclosure, there is provided a fabrication method of an array substrate. For example, The fabrication method of the array substrate comprises: forming a thin film transistor; forming a passivation layer covering the thin film transistor, the passivation layer having a via hole and the via hole exposing at least a portion of a drain electrode of the thin film transistor; forming a via-hole conductive layer, the via-hole conductive layer covering the portion of the drain electrode exposed at the via hole and connected to the drain electrode; treating the via-hole conductive layer, so that a reflectivity of the via-hole conductive layer is lower than a reflectivity of the drain electrode; and forming a pixel electrode, the pixel electrode being connected with the drain electrode through the via-hole conductive layer.

For example, the fabrication method of the array substrate further comprises: forming a common electrode. The via-hole conductive layer and the common electrode are formed simultaneously, and the via-hole conductive layer and the common electrode are disconnected from each other.

For example, the fabrication method of the array substrate further comprises: forming an inter-electrode insulating layer on the via-hole conductive layer and the common electrode; performing a patterning process on the inter-electrode insulating layer, so as to expose the via-hole conductive layer; and treating the via-hole conductive layer, so that the reflectivity of the via-hole conductive layer is lower than the reflectivity of the drain electrode.

For example, the fabrication method of the array substrate further comprises: forming the pixel electrode on the inter-electrode insulating layer.

For example, the via-hole conductive layer is formed integrally with the pixel electrode.

For example, the fabrication method of the array substrate further comprises: forming a pixel electrode layer; coating a photoresist on the pixel electrode layer, exposing and developing the photoresist by using a dual-tone mask to form a photoresist fully-reserved region, a photoresist partially-reserved region and a photoresist fully-removed region, the photoresist fully-reserved region corresponding to a region where the pixel electrode is to be formed, the photoresist partially-reserved region corresponding to a region where the via-hole conductive layer is to be formed, and the photoresist fully-removed region corresponding to other region; removing the pixel electrode layer in the photoresist fully-removed region by etching; removing the photoresist in the photoresist partially-reserved region by ashing to form the via-hole conductive layer; treating the via-hole conductive layer with remaining photoresist as a mask, so that the reflectivity of the via-hole conductive layer is lower than the reflectivity of the drain electrode; and removing the remaining photoresist to obtain the pixel electrode.

For example, the fabrication method of the array substrate further comprises: forming a pixel electrode layer; performing a patterning process on the pixel electrode layer by using a first single-tone mask to form the pixel electrode and the via-hole conductive layer; and treating the via-hole conductive layer by using a second single-tone mask, so that the reflectivity of the via-hole conductive layer is lower than the reflectivity of the drain electrode.

For example, the treating the via-hole conductive layer comprises: treating the via-hole conductive layer by a hydrogen treatment process.

For example, hydrogen plasma is used in the hydrogen treatment process.

For example, the fabrication method of the array substrate further comprises: forming a black matrix and a color filter layer. The black matrix is formed to correspond to the thin film transistor, and the color filter layer is formed to correspond to the pixel electrode.

For example, the fabrication method of the array substrate further comprises: forming an organic insulating layer. The organic insulating layer is formed between a layer where the pixel electrode is provided and a layer where the drain electrode is provided.

For example, the fabrication method of the array substrate further comprises: forming a spacer. The spacer is provided in a topmost layer of the array substrate.

According to embodiments of the disclosure, there is provided an array substrate. For example, the array substrate may comprise: a thin film transistor; a passivation layer, covering the thin film transistor, the passivation layer having a via hole and the via hole exposing at least a portion of a drain electrode of the thin film transistor; a via-hole conductive layer, covering the portion of the drain electrode exposed at the via hole and connected to the drain electrode, and a reflectivity of the via-hole conductive layer being lower than a reflectivity of the drain electrode; and a pixel electrode, connected with the drain electrode through the via-hole conductive layer.

For example, the array substrate further comprises a common electrode. The via-hole conductive layer and the common electrode layer are disposed in a same layer, and the via-hole conductive layer and the common electrode are disconnected from each other.

For example, the via-hole conductive layer and the pixel electrode are disposed in a same layer, and the via-hole conductive layer and the pixel electrode are connected with each other.

For example, the array substrate further comprises a black matrix and a color filter layer. The black matrix corresponds to the thin film transistor, and the color filter layer corresponds to the pixel electrode.

For example, the array substrate further comprises an organic insulating layer. The organic insulating layer is provided between a layer where the pixel electrode is provided and a layer where the drain electrode is provided.

For example, the array substrate further comprises a spacer. The spacer is provided in a topmost layer of the array substrate.

According to embodiments of the disclosure, there is provided a display device. For example, the display device comprises the array substrate as described above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DESCRIPTION OF THE EMBODIMENTS

Figure 1:
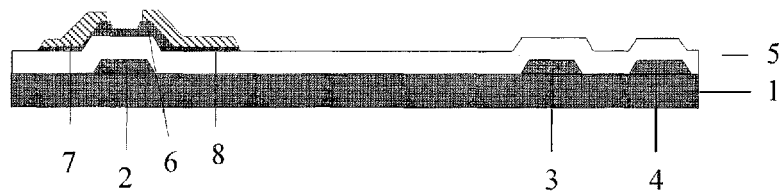
FIG. 1 is a schematic diagram of forming a thin film transistor in a fabrication method of an array substrate according to embodiments of the disclosure.

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the disclosure belongs. The terms "first," "second," etc., which are used in the description and the claims of the disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. "On," "under," "right," "left" and the like are only used to indicate relative position relationship, and when the position of the object which is described is changed, the relative position relationship may be changed accordingly.

According to embodiments of the disclosure, there is provided a fabrication method of an array substrate. The fabrication method of the array substrate comprises: forming a thin film transistor; forming a passivation layer covering the thin film transistor, the passivation layer having a via hole and the via hole exposing at least a portion of a drain electrode of the thin film transistor; forming a via-hole conductive layer, the via-hole conductive layer covering the portion of the drain electrode exposed at the via hole and connected to the drain electrode; treating the via-hole conductive layer, so that a reflectivity of the via-hole conductive layer is lower than a reflectivity of the drain electrode; and forming a pixel electrode, the pixel electrode being connected with the drain electrode through the via-hole conductive layer.

In the fabrication method of the array substrate according to the embodiments of the disclosure, since the via-hole conductive layer covers the portion of the drain electrode exposed at the via hole and the reflectivity of the via-hole conductive layer after being treated is lower than the reflectivity of the drain electrode, light reflection of the drain electrode can be avoided and display quality of the display device can be improved.

In the fabrication method of the array substrate according to the embodiments of the disclosure, the via-hole conductive layer may be formed by an individual process and the via-hole conductive layer may be treated by another individual process to reduce the reflectivity thereof. However, in order to simplify the fabrication process and reduce fabrication cost, it is desirable that the step of forming the via-hole conductive layer and the step of treating the via-hole conductive layer to reduce the reflectivity thereof are performed simultaneously with the steps of forming other components of the array substrate. For example, in one case: the via-hole conductive layer and the common electrode are formed simultaneously; and in the other case: the via-hole conductive layer and the pixel electrode are formed simultaneously. Here, as an example, the fabrication method of the array substrate in the above-described two cases will be described in detail in conjunction with the accompanying drawings.

[The Via-Hole Conductive Layer and the Common Electrode are Formed Simultaneously]

FIG. 1 to FIG. 10 are schematic diagrams illustrating the fabrication method of the array substrate according to embodiments of the disclosure. As shown in FIG. 1 to FIG. 10, the fabrication method of the array substrate according to the embodiments of the disclosure comprises the following steps.

Firstly, a thin film transistor is formed on a base substrate 1, as shown in FIG. 1. The thin film transistor is of a bottom gate type or a top gate type. As an example, the thin film transistor of bottom gate type is shown in the drawings.

The thin film transistor comprises a gate electrode 2, a gate insulating layer 5, an active layer 6, a source electrode 7 and a drain electrode 8. At the time that the gate electrode 2 is formed, gate lines (not shown), common electrode lines 3 and an interface pad 4 may be formed simultaneously. At the time that the source electrode 7 and the drain electrode 8 are formed, data lines (not shown) may be formed simultaneously. The gate lines and the data lines intersect with each other to define a plurality of pixel units in the form of a matrix. In the drawings, as an example, only one pixel unit is shown, but other pixel units may be formed similarly.

Figure 2:
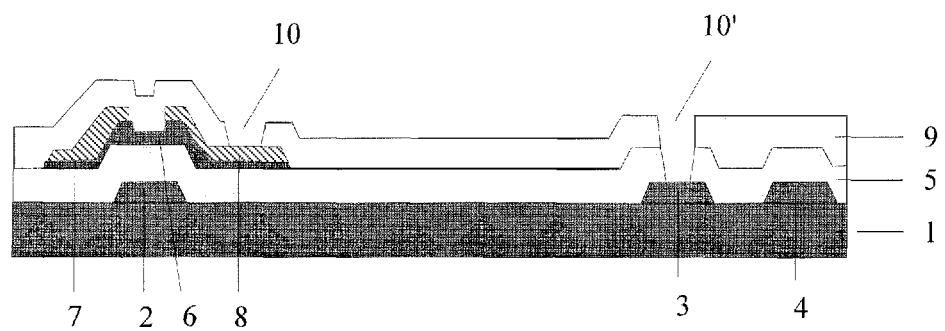
FIG. 2 is a schematic diagram of forming a passivation layer and a via hole in the fabrication method of the array substrate according to the embodiments of the disclosure.

Next, a passivation layer 9 is formed, and a patterning process is performed on the passivation layer 9 to form a via hole 10 in the passivation layer 9, as shown in FIG. 2. The via hole 10 is provided at the drain electrode 8 of the thin film transistor, to expose at least a portion of the drain electrode 8. At the time that the via hole 10 is formed, an additional via hole 10' may be formed simultaneously. The additional via hole 10' is provided at the common electrode line 3 and extends through the gate insulating layer 5 to expose a portion of the common electrode line 3.

Figure 3:
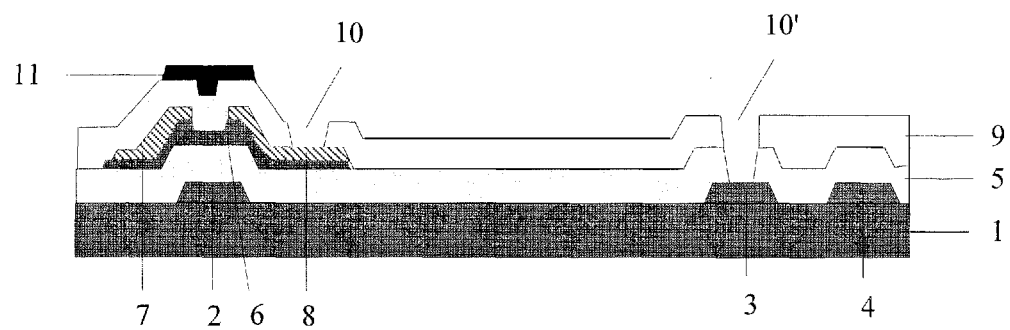
FIG. 3 is a schematic diagram of forming a black matrix in the fabrication method of the array substrate according to the embodiments of the disclosure.
Figure 4:
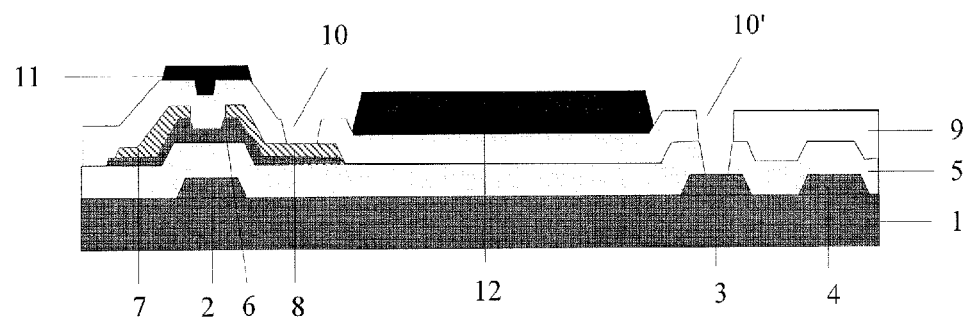
FIG. 4 is a schematic diagram of forming a color filter layer in the fabrication method of the array substrate according to the embodiments of the disclosure.

Next, a black matrix 11 and a color filter layer 12 are formed, as shown in FIG. 3 and FIG. 4. The black matrix 11 is formed to correspond to the thin film transistor, and the color filter layer 12 is formed to correspond to the pixel electrode which is formed subsequently.

For example, the array substrate comprises a red pixel unit, a green pixel unit and a blue pixel unit; and accordingly, the color filter layer 12 comprises a red color filter provided in the red pixel unit, a green color filter provided in the green pixel unit, and a blue color filter provided in the blue pixel unit. The red color filter, the green color filter and the blue color filter are formed by different patterning processes.

Figure 5:
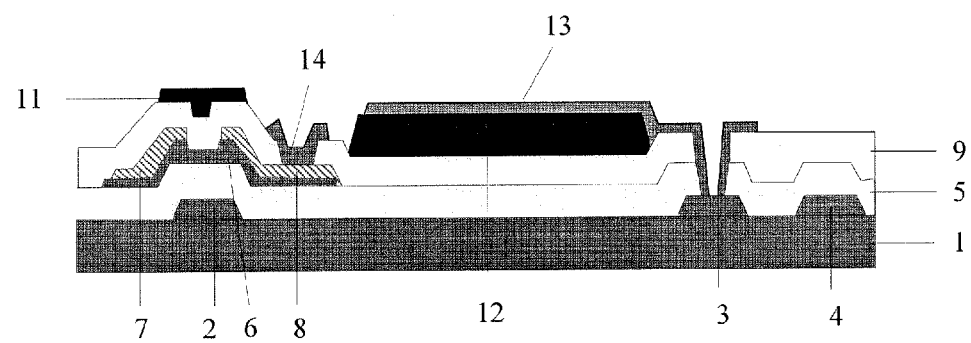
FIG. 5 is a schematic diagram of forming a common electrode and a via-hole conductive layer in the fabrication method of the array substrate according to the embodiments of the disclosure.

Next, a common electrode 13 and a via-hole conductive layer 14 are formed, as shown in FIG. 5. Specifically, first of all, a common electrode layer is deposited, and then a patterning process is performed on the common electrode layer to simultaneously form the common electrode 13 and the via-hole conductive layer 14. The common electrode 13 and the via-hole conductive layer 14 are disconnected from each other. The common electrode 13 is connected to the common electrode line 3 through the additional via hole 10'. The via-hole conductive layer 14 is provided at the via hole 10. Further, the via-hole conductive layer 14 covers the portion of the drain electrode 8 exposed at the via hole 10 and is connected with the drain electrode 8. For example, the common electrode 13 and the via-hole conductive layer 14 are made of transparent conductive oxides such as Indium Tin Oxide (ITO), Indium Zinc Oxide (IZO), tin oxide and so on.

Figure 6:
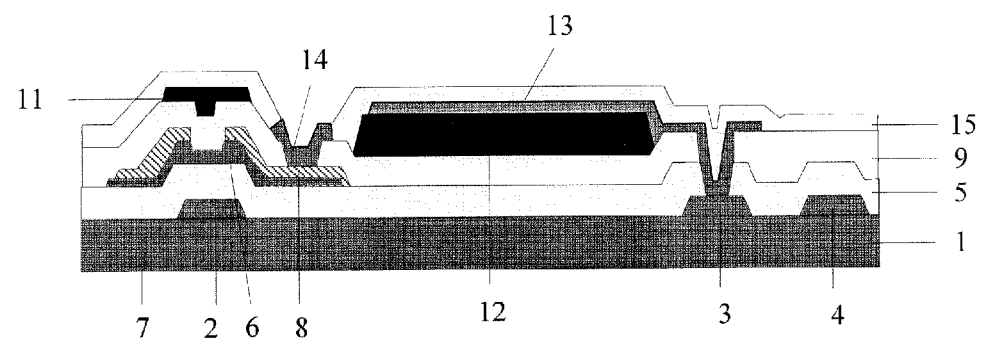
FIG. 6 is a schematic diagram of forming an inter-electrode insulating layer in the fabrication method of the array substrate according to the embodiments of the disclosure.

Next, an inter-electrode insulating layer 15 is formed and a patterning process is performed on the inter-electrode insulating layer 15 to expose the via-hole conductive layer 14, as shown in FIG. 6. The inter-electrode insulating layer 15 covers the whole substrate and only exposes the via-hole conductive layer 14.

Figure 7:
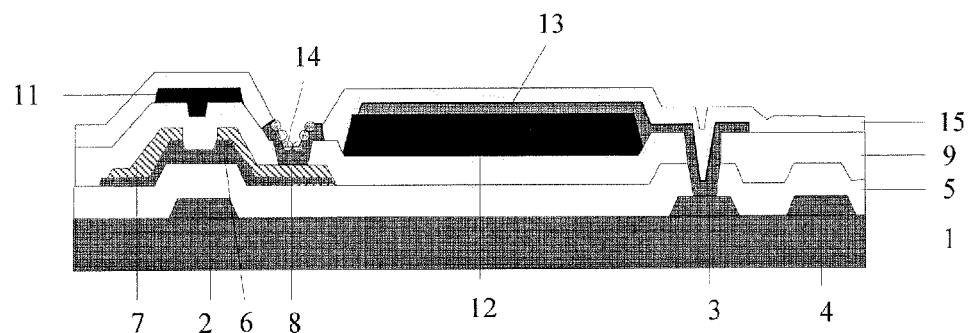
FIG. 7 is a schematic diagram of treating the via-hole conductive layer to reduce reflectivity thereof in the fabrication method of the array substrate according to the embodiments of the disclosure.

Next, the exposed via-hole conductive layer 14 is treated, to reduce the reflectivity thereof, as shown in FIG. 7. For example, the exposed via-hole conductive layer 14 is treated by a hydrogen treatment process, and further, hydrogen plasma is used in the hydrogen treatment process. For example, the hydrogen treatment process is performed on the via-hole conductive layer 14 under a pressure of 40-200 mtorr for 10-300 seconds. Further, for example, the hydrogen treatment process is performed on the via-hole conductive layer 14 under a pressure of 60 mtorr for 60 seconds. As described above, the via-hole conductive layer for example is made of ITO, which typically contains 90% of $In_2O_3$ and 10% of $SnO_2$; upon the hydrogen treatment process is performed, hydrogen reduces Sn in the $SnO_2$ and the reduced Sn precipitates to form black spots on the surface of the ITO, so that the surface of the via-hole conductive layer 14 becomes hazing and the reflectivity of the via-hole conductive layer 14 is significantly lowered and is lower than the reflectivity of the drain electrode 8 made of metal. Since the via-hole conductive layer 14 covers the portion of the drain electrode 8 exposed at the via hole 10 and the reflectivity of the via-hole conductive layer 14 after being treated is lower than the reflectivity of the drain electrode 8, it avoids the case that the drain electrode 8 reflects the ambient light, thus the display quality of the display device is improved.

In addition, as shown in FIG. 7, in the above-described step of treating the exposed via-hole conductive layer 14 to reduce the reflectivity thereof, the inter-electrode insulating layer 15 protects the whole substrate from being affected, so it is unnecessary to arrange a dedicated mask to protect the substrate in this step. Thus, the fabrication process can be further simplified and the fabrication cost can be further reduced.

Figure 8:
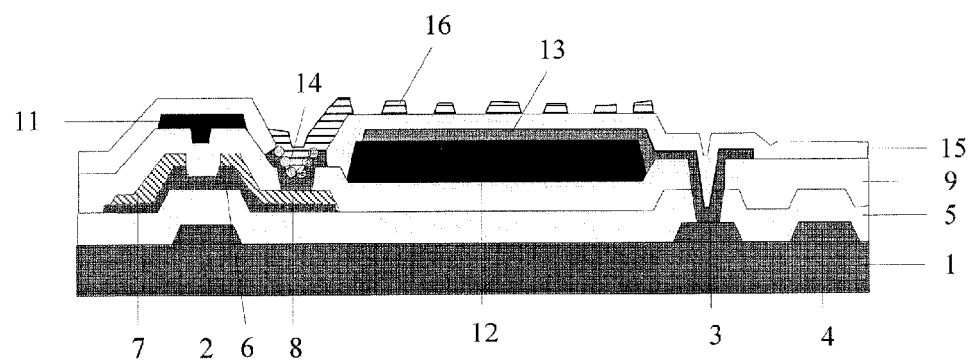
FIG. 8 is a schematic diagram of forming a pixel electrode in the fabrication method of the array substrate according to the embodiments of the disclosure.

Finally, a pixel electrode 16 is formed, as shown in FIG. 8. For example, the pixel electrode 16 is made of transparent conductive oxides such as Indium Tin Oxide (ITO), Indium Zinc Oxide (IZO), tin oxide and so on, and the pixel electrode 16 is a slit electrode having a plurality of slits. The pixel electrode 16 is connected to the drain electrode 8 of the thin film transistor through the via-hole conductive layer 14.

[The Via-Hole Conductive Layer and the Pixel Electrode are Formed Simultaneously]

Next, the case that the via-hole conductive layer and the pixel electrode are formed simultaneously will be described in detail with reference to FIG. 11. In the following description, only features different from those in the case where the via-hole conductive layer and the common electrode are formed simultaneously will be described, and the same features will not be repeated.

In the fabrication method of the array substrate according to the embodiments of the disclosure, the via-hole conductive layer 14 and the pixel electrode 16 are formed simultaneously and connected to each other. As shown in FIG. 11, the via-hole conductive layer 14 and the pixel electrode 16 are integrally formed.

For example, in the process of forming the via-hole conductive layer 14 and the pixel electrode 16 and treating the via-hole conductive layer 14 to reduce the reflectivity thereof, a dual-tone mask (e.g., a gray-tone mask or a half-tone mask) is used. Firstly, the pixel electrode layer is formed; then the photoresist is coated on the pixel electrode layer, the photoresist is exposed and developed by using the dual-tone mask to form a photoresist fully-reserved region, a photoresist partially-reserved region and a photoresist fully-removed region, the photoresist fully-reserved region corresponds to a region where the pixel electrode is to be formed, the photoresist partially-reserved region corresponds to a region where the via-hole conductive layer is to be formed, and the photoresist fully-removed region corresponds to other region; the pixel electrode layer of the photoresist fully-removed region is removed by etching; the photoresist in the photoresist partially-reserved region is removed by ashing to form the via-hole conductive layer; with the remaining photoresist as the mask, the via-hole conductive layer is treated so that the reflectivity of the via-hole conductive layer is lower than the reflectivity of the drain electrode; and the remaining photoresist is removed to obtain the pixel electrode. Sine in the process of forming the via-hole conductive layer 14 and the pixel electrode 16 and treating the via-hole conductive layer 14 to reduce the reflectivity thereof, only one dual-tone mask is used, the fabrication process can be further simplified and the fabrication cost can be further reduced.

For example, the pixel electrode 16 and the via-hole conductive layer 14 are made of transparent conductive oxides such as Indium Tin Oxide (ITO), Indium Zinc Oxide (IZO), tin oxide and so on.

For example, the via-hole conductive layer 14 is treated by a hydrogen treatment process, and further, hydrogen plasma is used in the hydrogen treatment process. For example, the hydrogen treatment process is performed on the via-hole conductive layer 14 under a pressure of 40-200 mtorr for 10-300 seconds. Further, for example, the hydrogen treatment process is performed on the via-hole conductive layer 14 under a pressure of 60 mtorr for 60 seconds. As described above, the via-hole conductive layer for example is made of ITO, which typically contains 90% of $In_2O_3$ and 10% of $SnO_2$; upon the hydrogen treatment process is performed, hydrogen reduces Sn in the $SnO_2$ and the reduced Sn precipitates to form black spots on the surface of the ITO, so that the surface of the via-hole conductive layer 14 becomes hazing and the reflectivity of the via-hole conductive layer 14 is significantly lowered and is lower than the reflectivity of the drain electrode 8 made of metal. Since the via-hole conductive layer 14 covers the portion of the drain electrode 8 exposed at the via hole 10 and the reflectivity of the via-hole conductive layer 14 after being treated is lower than the reflectivity of the drain electrode 8, it avoids the case that the drain electrode 8 reflects the ambient light, thus the display quality of the display device is improved.

Of course, in the process of forming the via-hole conductive layer 14 and the pixel electrode 16 and treating the via-hole conductive layer 14 to reduce the reflectivity thereof, two single-tone masks are used. Firstly, the pixel electrode layer is formed; then a patterning process is performed on the pixel electrode layer by using a first single-tone mask to obtain the pixel electrode and the via-hole conductive layer that are formed integrally; finally, the via-hole conductive layer 14 is treated by using a second single-tone mask, so that the reflectivity thereof is lower than the reflectivity of the drain electrode.

For example, the treating the via-hole conductive layer 14 by using the second single-tone mask so that the reflectivity thereof is lower than the reflectivity of the drain electrode comprises: coating the photoresist to cover the whole substrate; exposing and developing the photoresist by using the second single-tone mask to form the photoresist fully-removed region and the photoresist fully-reserved region, the photoresist fully-removed region corresponding to the via-hole conductive layer, and the photoresist fully-reserved region corresponding to other region; treating the via-hole conductive layer of the photoresist fully-removed region so that the reflectivity thereof is lower than the reflectivity of the drain electrode; and removing the photoresist of the photoresist fully-reserved region.

Figure 11:
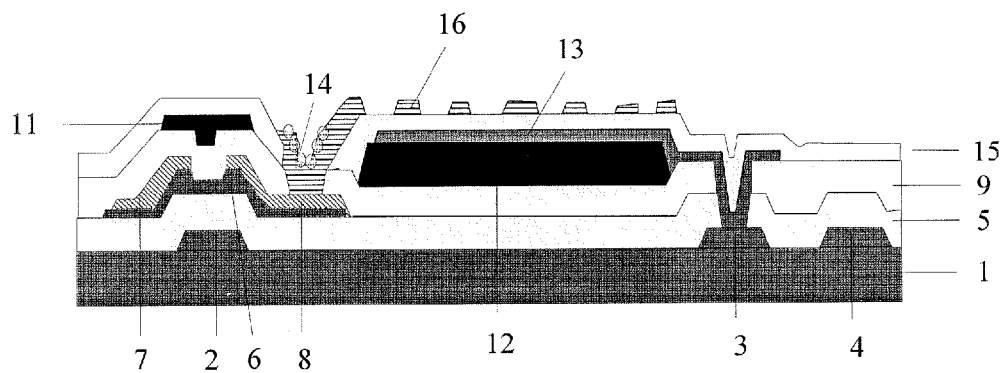
FIG. 11 is a schematic diagram of forming the pixel electrode and the via-hole conductive layer in the fabrication method of the array substrate according to the embodiments of the disclosure.

It should be noted that, although FIG. 11 shows the array substrate of the display device in an ADS mode, the technical solution that the via-hole conductive layer and the pixel electrode are formed simultaneously is also applicable to the array substrate of the display device in a VA mode, an IPS mode and the like.

Figure 9:
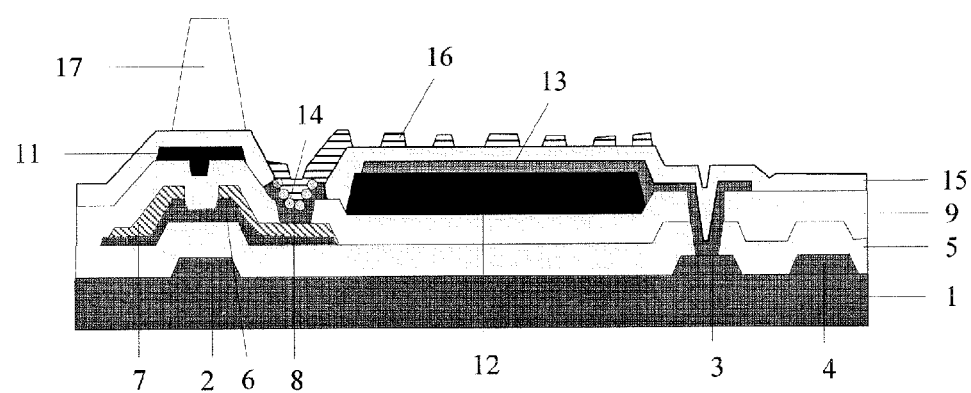
FIG. 9 is a schematic diagram of forming a spacer in the fabrication method of the array substrate according to the embodiments of the disclosure.

It should be noted that, in the fabrication method of the array substrate according to the embodiments of the disclosure, in addition to the above-described steps, a spacer 17 may be further formed, as shown in FIG. 9. After the array substrate is bonded with an opposite substrate, the spacer 17 is used for maintaining a cell gap between the array substrate and the opposite substrate. For example, the spacer 17 is provided in a topmost layer of the array substrate.

Figure 10:
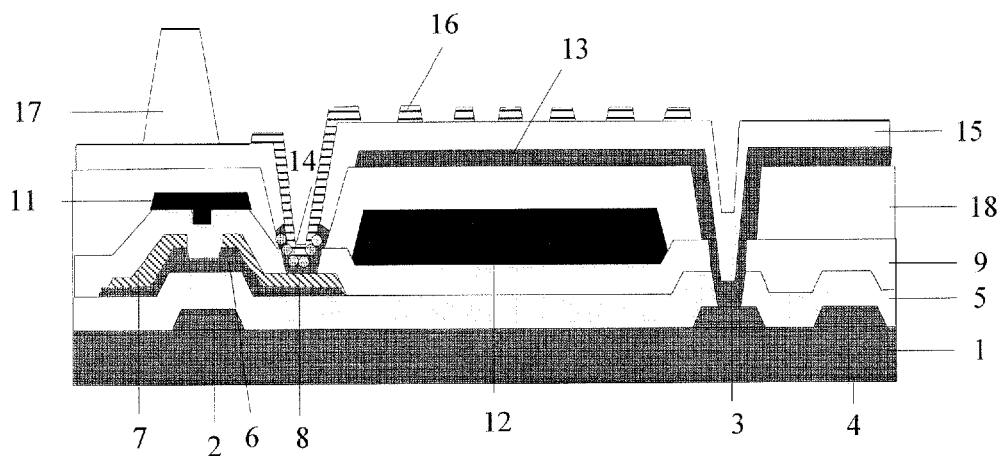
FIG. 10 is a schematic diagram of forming an organic insulating layer in the fabrication method of the array substrate according to the embodiments of the disclosure.

It should be noted that, in the fabrication method of the array substrate according to the embodiments of the disclosure, in addition to the above steps, an organic insulating layer 18 may further be formed, as shown in FIG. 10. The organic insulating layer 18 is provided between a layer where the pixel electrode 16 is provided and a layer where the drain electrode 8 is provided, to reduce a parasitic capacitance between the layer where the pixel electrode 16 is provided and the layer where the drain electrode 8 is provided, for example, a parasitic capacitance $C_{pd}$ between the pixel electrode 16 and the data lines. For example, the organic insulating layer 18 is made of polyimide, epoxy resin and the like.

It should be noted that, in the fabrication method of the array substrate according to the embodiments of the disclosure, the base substrate 1, the gate electrode 2, the gate insulating layer 5, the active layer 6, the source electrode 7 and the drain electrode 8, the passivation layer 9, the black matrix 11, the color filter layer 12, the inter-electrode insulating layer 15 and the spacer 17 may be made of any known materials by any known processes, which will not be repeated here.

According to the embodiments of the disclosure, there is further provided an array substrate. The array substrate comprises: a thin film transistor; a passivation layer, covering the thin film transistor, the passivation layer having a via hole and the via hole exposing at least a portion of a drain electrode of the thin film transistor; a via-hole conductive layer, covering the portion of the drain electrode exposed at the via hole and connected to the drain electrode, a reflectivity of the via-hole conductive layer being lower than a reflectivity of the drain electrode; and a pixel electrode, connected with the drain electrode through the via-hole conductive layer.

In the array substrate according to the embodiments of the disclosure, since the via-hole conductive layer covers the portion of the drain electrode exposed at the via hole and the reflectivity of the via-hole conductive layer is lower than the reflectivity of the drain electrode, light reflection of the drain electrode can be avoided and display quality of the display device can be improved.

According to the embodiments of the disclosure, there is further provided a display device. The display device comprises the array substrate according to any of the embodiments described above. The display device comprises the array substrate and an opposite substrate, the array substrate and the opposite substrate are bonded with each other to form a liquid crystal cell in which liquid crystal material is filled. The opposite substrate is, for example, a color filter substrate. In some examples, the liquid crystal display device further comprises a backlight unit for providing backlight for the array substrate. The liquid crystal display device, for example, may be implemented as: a liquid crystal display panel, an electronic paper, an organic light-emitting diode (OLED) panel, a mobile phone, a tablet personal computer, a television, a monitor, a notebook computer, a digital photo frame, a navigator, a watch and any other products or components having a display function.

Since the display device according to the embodiments of the disclosure comprises the array substrate as described above, light reflection of the drain electrode can be avoided and the display quality of the display device can be improved.

The foregoing embodiments merely are exemplary embodiments of the disclosure, and not intended to define the scope of the disclosure, and the scope of the disclosure is determined by the appended claims.

The disclosure claims priority to and contains subject matters related to that disclosed in Chinese Priority Patent Application CN201410697709.1 filed on Nov. 26, 2014, the entire content of which is hereby incorporated by reference.

What is claimed is:

1. A fabrication method of an array substrate, the array substrate comprising gate lines and data lines intersecting with each other to define a plurality of pixel units, the method comprising:
   forming a thin film transistor;
   forming a passivation layer covering the thin film transistor, the passivation layer having a via hole and the via hole exposing at least a portion of a drain electrode of the thin film transistor;
   forming a via-hole conductive layer, the via-hole conductive layer covering the portion of the drain electrode exposed at the via hole and connected to the drain electrode;
   treating the via-hole conductive layer, so that a reflectivity of the via-hole conductive layer is lower than a reflectivity of the drain electrode; and
   forming a pixel electrode, the pixel electrode being connected with the drain electrode through the via-hole conductive layer,
   wherein the via-hole conductive layer is provided at the via hole so that no portions of the via-hole conductive layer extent into a display region of each pixel unit.

2. The fabrication method of the array substrate according to claim 1, further comprising: forming a common electrode, wherein the via-hole conductive layer and the common electrode are formed simultaneously, and the via-hole conductive layer and the common electrode are disconnected from each other.

3. The fabrication method of the array substrate according to claim 2, further comprising:
   forming an inter-electrode insulating layer on the via-hole conductive layer and the common electrode;
   performing a patterning process on the inter-electrode insulating layer, so as to expose the via-hole conductive layer; and
   treating the via-hole conductive layer, so that the reflectivity of the via-hole conductive layer is lower than the reflectivity of the drain electrode.

4. The fabrication method of the array substrate according to claim 3, further comprising:
   forming the pixel electrode on the inter-electrode insulating layer.

5. The fabrication method of the array substrate according to claim 1, wherein the via-hole conductive layer is formed integrally with the pixel electrode.

6. The fabrication method of the array substrate according to claim 5, further comprising:
   forming a pixel electrode layer;
   coating a photoresist on the pixel electrode layer, exposing and developing the photoresist by using a dual-tone mask to form a photoresist fully-reserved region, a photoresist partially-reserved region and a photoresist fully-removed region, the photoresist fully-reserved region corresponding to a region where the pixel electrode is to be formed, the photoresist partially-reserved region corresponding to a region where the via-hole conductive layer is to be formed, and the photoresist fully-removed region corresponding to other region;
   removing the pixel electrode layer in the photoresist fully-removed region by etching;
   removing the photoresist in the photoresist partially-reserved region by aching to form the via-hole conductive layer;
   treating the via-hole conductive layer with remaining photoresist as a mask, so that the reflectivity of the via-hole conductive layer is lower than the reflectivity of the drain electrode; and
   removing the remaining photoresist to obtain the pixel electrode.

7. The fabrication method of the array substrate according to claim 5, further comprising:
   forming a pixel electrode layer;
   performing a patterning process on the pixel electrode layer by using a first single-tone mask to form the pixel electrode and the via-hole conductive layer; and
   treating the via-hole conductive layer by using a second single-tone mask, so that the reflectivity of the via-hole conductive layer is lower than the reflectivity of the drain electrode.

8. The fabrication method of the array substrate according to claim 1, wherein the treating the via-hole conductive layer comprises: treating the via-hole conductive layer by a hydrogen treatment process.

9. The fabrication method of the array substrate according to claim 8, wherein hydrogen plasma is used in the hydrogen treatment process.

10. The fabrication method of the array substrate according to claim 1, further comprising: forming a black matrix and a color filter layer, wherein the black matrix is formed to correspond to the thin film transistor, and the color filter layer is formed to correspond to the pixel electrode.

11. The fabrication method of the array substrate according to claim 1, further comprising: forming an organic insulating layer, wherein the organic insulating layer is formed between a layer where the pixel electrode is provided and a layer where the drain electrode is provided.

12. The fabrication method of the array substrate according to claim 1, further comprising: forming a spacer, wherein the spacer is provided in a topmost layer of the array substrate.

13. A fabrication method of an array substrate, comprising:
   forming a thin film transistor;
   forming a passivation layer covering the thin film transistor, the passivation layer having a via hole and the via hole exposing at least a portion of a drain electrode of the thin film transistor;
   forming a via-hole conductive layer, the via-hole conductive layer covering the portion of the drain electrode exposed at the via hole and connected to the drain electrode;
   treating the via-hole conductive layer, so that a reflectivity of the via-hole conductive layer is lower than a reflectivity of the drain electrode; and
   forming a pixel electrode, the pixel electrode being connected with the drain electrode through the via-hole conductive layer,
   wherein the method further comprises:
   forming a pixel electrode layer;
   coating a photoresist on the pixel electrode layer, exposing and developing the photoresist by using a dual-tone mask to form a photoresist fully-reserved region, a photoresist partially-reserved region and a photoresist fully-removed region, the photoresist fully-reserved region corresponding to a region where the pixel electrode is to be formed, the photoresist partially-reserved region corresponding to a region where the via-hole conductive layer is to be formed, and the photoresist fully-removed region corresponding to other region;
   removing the pixel electrode layer in the photoresist fully-removed region by etching;
   removing the photoresist in the photoresist partially-reserved region by ashing to form the via-hole conductive layer;
   treating the via-hole conductive layer with remaining photoresist as a mask, so that the reflectivity of the via-hole conductive layer is lower than the reflectivity of the drain electrode; and
   removing the remaining photoresist to obtain the pixel electrode.

14. A fabrication method of an array substrate, comprising:
   forming a thin film transistor;
   forming a passivation layer covering the thin film transistor, the passivation layer having a via hole and the via hole exposing at least a portion of a drain electrode of the thin film transistor;
   forming a via-hole conductive layer, the via-hole conductive layer covering the portion of the drain electrode exposed at the via hole and connected to the drain electrode;
   treating the via-hole conductive layer, so that a reflectivity of the via-hole conductive layer is lower than a reflectivity of the drain electrode; and
   forming a pixel electrode, the pixel electrode being connected with the drain electrode through the via-hole conductive layer,
   wherein the method further comprises:
   forming a pixel electrode layer;
   performing a patterning process on the pixel electrode layer by using a first single-tone mask to form the pixel electrode and the via-hole conductive layer; and
   treating the via-hole conductive layer by using a second single-tone mask, so that the reflectivity of the via-hole conductive layer is lower than the reflectivity of the drain electrode.

* * * * *